United States Patent
Li et al.

(10) Patent No.: US 9,214,749 B2
(45) Date of Patent: Dec. 15, 2015

(54) PLUGGABLE APPARATUS OF CIRCUIT BOARD, AND SERVER

(71) Applicant: Huawei Technologies Co., Ltd., Shenzhen (CN)

(72) Inventors: Shuang Li, Hangzhou (CN); Yao Li, Shenzhen (CN); Feng Ao, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 77 days.

(21) Appl. No.: 14/285,941

(22) Filed: May 23, 2014

(65) Prior Publication Data
US 2014/0254086 A1    Sep. 11, 2014

Related U.S. Application Data

(63) Continuation of application No. PCT/CN2013/072401, filed on Mar. 11, 2013.

(30) Foreign Application Priority Data

Jun. 21, 2012   (CN) .......................... 2012 1 0208461

(51) Int. Cl.
*H05K 5/00*    (2006.01)
*H01R 12/72*    (2011.01)
(Continued)

(52) U.S. Cl.
CPC ............. *H01R 12/725* (2013.01); *G06F 1/185* (2013.01); *H01R 12/7005* (2013.01); *H01R 12/7058* (2013.01); *H01R 13/62944* (2013.01); *H05K 7/1489* (2013.01); *H01R 43/26* (2013.01)

(58) Field of Classification Search
CPC . H05K 7/1409; H05K 7/1461; H05K 7/1402; H05K 5/0221; H05K 5/0286; H05K 5/0295; H05K 7/14; G06F 1/186; G06F 1/184
See application file for complete search history.

(56) References Cited

U.S. PATENT DOCUMENTS

| 4,384,368 A | 5/1983 | Rosenfeldt et al. |
| 5,657,204 A | 8/1997 | Hunt |

(Continued)

FOREIGN PATENT DOCUMENTS

| CN | 201063134 Y | 5/2008 |
| CN | 101207987 A | 6/2008 |

(Continued)

OTHER PUBLICATIONS

Foreign Communication From a Counterpart Application, PCT Application No. PCT/CN2013/072401, English Translation of International Search Report dated Jul. 11, 2013, 4 pages.

(Continued)

*Primary Examiner* — Robert J Hoffberg
*Assistant Examiner* — Hung Dang
(74) *Attorney, Agent, or Firm* — Conley Rose, P.C.; Grant Rodolph; Nicholas K. Beaulieu

(57) ABSTRACT

A pluggable apparatus of a circuit board is provided, which solves the problem that hot plugging of a Peripheral Component Interconnect Express (PCI-E) card is difficult to implement. The pluggable apparatus of the circuit board includes a base plate, a pulling strip, a rotating member, and a carrier plate, where the pulling strip is movably connected to the base plate by using a transverse guide mechanism, sawteeth are formed on a body of the pulling strip, the pulling strip further includes a handle that extends out of the base plate; the rotating member is in a bending line shape; the carrier plate is movably connected to the base plate by using a longitudinal guide mechanism; and a clamping trough is disposed on the carrier plate and is configured to fasten the circuit board.

10 Claims, 11 Drawing Sheets

(51) Int. Cl.
*H01R 13/629* (2006.01)
*G06F 1/18* (2006.01)
*H01R 12/70* (2011.01)
*H05K 7/14* (2006.01)
*H01R 43/26* (2006.01)

(56) References Cited

U.S. PATENT DOCUMENTS

| | | | |
|---|---|---|---|
| 5,815,377 A | 9/1998 | Lund et al. | |
| 5,889,850 A | 3/1999 | Sochacki | |
| 6,071,143 A | 6/2000 | Barthel et al. | |
| 6,162,073 A | 12/2000 | Haq et al. | |
| 6,288,911 B1 * | 9/2001 | Aoki | H05K 7/1409 211/41.17 |
| 6,406,322 B1 | 6/2002 | Barringer et al. | |
| 6,411,517 B1 | 6/2002 | Babin | |
| 6,667,890 B1 * | 12/2003 | Barringer | G06F 1/184 361/752 |
| 6,674,651 B2 * | 1/2004 | Momiyama | H01R 12/82 174/50 |
| 6,685,489 B1 * | 2/2004 | Rubenstein | H05K 7/1409 439/157 |
| 6,698,937 B2 | 3/2004 | Grimes et al. | |
| 6,930,892 B2 * | 8/2005 | Barringer | H05K 5/0295 361/726 |
| 7,145,780 B2 | 12/2006 | Malone et al. | |
| 7,215,556 B2 | 5/2007 | Wrycraft | |
| 7,265,968 B2 * | 9/2007 | Champion | G06F 1/185 361/679.01 |
| 7,283,371 B1 | 10/2007 | Grouell et al. | |
| 7,297,015 B1 * | 11/2007 | Desrosiers | H05K 7/1402 361/755 |
| 7,364,447 B1 * | 4/2008 | Desrosiers | G06F 1/186 439/157 |
| 7,420,816 B2 * | 9/2008 | Rubenstein | H05K 7/1461 361/727 |
| 7,435,114 B2 | 10/2008 | Desrosiers et al. | |
| 2012/0099284 A1 * | 4/2012 | Boetzer | H05K 7/1409 361/754 |
| 2012/0240704 A1 * | 9/2012 | Li | H05K 7/1409 74/412 R |

FOREIGN PATENT DOCUMENTS

| | | |
|---|---|---|
| CN | 101801164 A | 8/2010 |
| CN | 101873781 A | 10/2010 |
| CN | 101901990 A | 12/2010 |
| CN | 201752168 U | 2/2011 |
| CN | 101986774 A | 3/2011 |
| CN | 201845266 U | 5/2011 |
| CN | 202258342 U | 5/2012 |
| CN | 102738685 A | 10/2012 |
| EP | 0040753 A2 | 5/1981 |

OTHER PUBLICATIONS

Foreign Communication From a Counterpart Application, PCT Application No. PCT/CN2013/072401, Written Opinion dated Jul. 11, 2013, 5 pages.

Foreign Communication From a Counterpart Application, Chinese Application No. 201210208461.9, Chinese Office Action dated Jan. 30, 2014, 9 pages.

Partial English Translation and Abstract of Chinese Patent Application No. CN201845266, Part 1, Aug. 5, 2014, 5 pages.

Partial English Translation and Abstract of Chinese Patent Application No. CN201845266, Part 2, Aug. 5, 2014, 2 pages.

* cited by examiner

PLUGGABLE APPARATUS OF CIRCUIT BOARD, AND SERVER

CROSS-REFERENCE TO RELATED APPLICATIONS

This application is a continuation of International Application No. PCT/CN2013/072401, filed on Mar. 11, 2013, which claims priority to Chinese Patent Application No. 201210208461.9, filed on Jun. 21, 2012, both of which are hereby incorporated by reference in their entireties.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention belongs to the field of electronic assembly technologies, and in particular, relates to a pluggable apparatus of a circuit board, and a server.

BACKGROUND

A Peripheral Component Interconnect Express (PCI-E) card is used for interconnection of peripheral components of a computer or a communications platform and is commonly applied to a product such as a server. The PCI-E card can further support hot plugging to improve maintainability of a device and meet an assembly requirement.

A connector (also referred to as a golden finger) of the PCI-E card and an installation panel are respectively located on two adjacent sides of the PCI-E card, and therefore interface directions of the connector and the installation panel are perpendicular to each other. At present, to insert a connector of a PCI-E card into a slot of a chassis, a chassis cover needs to be opened first, the PCI-E card is placed in the interior of the chassis, and then the connector of the PCI-E card is inserted into the slot. On the contrary, the chassis cover also needs to be opened first to pull the connector of the PCI-E card out of the slot.

Because interface directions of a connector of a PCI-E card and an installation panel are perpendicular to each other, and therefore plugging of the connector can be implemented only after a chassis cover is opened first, and hot plugging of the PCI-E card without opening the chassis cover is difficult to implement.

SUMMARY

Embodiments of the present invention provide a pluggable apparatus of a circuit board and a server disposed with the pluggable apparatus of the circuit board, so as to implement hot plugging of a PCI-E card.

In order to achieve the foregoing objective, the embodiments of the present invention adopt the following technical solutions:

A pluggable apparatus of a circuit board includes a base plate, a pulling strip, a rotating member, and a carrier plate, where the pulling strip is movably connected to the base plate by using a transverse guide mechanism, sawteeth are formed on a body of the pulling strip, and the pulling strip further includes a handle that extends out of the base plate, where the handle is used as a holding part for moving the pulling strip; the rotating member is in a bending line shape, and the rotating member includes a first arm, a first rotating shaft, and a second arm, where the first rotating shaft is disposed at a turning of the rotating member, and the first rotating shaft is configured to movably connect the rotating member and the base plate; the first arm and the second arm are connected by using the first rotating shaft, where sawteeth are formed on a tail end of the first arm and are engaged with the sawteeth on the pulling strip, and the second arm is movably connected to the carrier plate by using a transmission mechanism; the carrier plate is movably connected to the base plate by using a longitudinal guide mechanism; and a clamping trough is provided on the carrier plate and is configured to fasten the circuit board.

A server is provided, where the interior of a chassis of the server includes a slot, a circuit board (such as a PCI-E card), and the foregoing pluggable apparatus of the circuit board; the circuit board is fastened on the pluggable apparatus, and the pluggable apparatus is configured to insert a connector of the circuit board into the slot or pull the connector of the circuit board out of the slot.

Compared with the prior art, the technical solutions provided in the present invention have the following advantages: a pulling strip can transversely move relative to a base plate by using a transverse guide mechanism and drive, by using engaged sawteeth, a rotating member to rotate around a first rotating shaft. Because the rotating member is in a bending line shape, under the driving of the pulling strip, at the same time when a first arm transversely swings, a second arm longitudinally swings, and the second arm drives, by using a transmission mechanism, a carrier plate to move. Under the co-action of a longitudinal guide mechanism and the transmission mechanism, the carrier plate longitudinally moves relative to the base plate.

A PCI-E card is first fastened on the carrier plate through a clamping trough to make the PCI-E card and a pluggable apparatus form an entirety. When the PCI-E card is located inside a chassis of a device, in a case that the device is powered on, the carrier plate can drive, by transversely moving the pulling strip, the PCI-E card to longitudinally move, so that a connector of the PCI-E card is inserted into or pulled out of a slot inside the device, thereby implementing hot plugging of the PCI-E card.

BRIEF DESCRIPTION OF THE DRAWINGS

To illustrate the technical solutions in the embodiments of the present invention more clearly, the following briefly introduces the accompanying drawings for describing the embodiments. The accompanying drawings in the following description show merely some embodiments of the present invention, and a person of ordinary skill in the art may still derive other drawings from the accompanying drawings without creative efforts.

DETAILED DESCRIPTION

The following clearly describes the technical solutions in the embodiments of the present invention with reference to the accompanying drawings in the embodiments of the present invention. The described embodiments are merely a part rather than all of the embodiments of the present invention. All other embodiments obtained by a person of ordinary skill in the art based on the embodiments of the present invention without creative efforts shall fall within the protection scope of the present invention.

Embodiment 1

Figure 1:
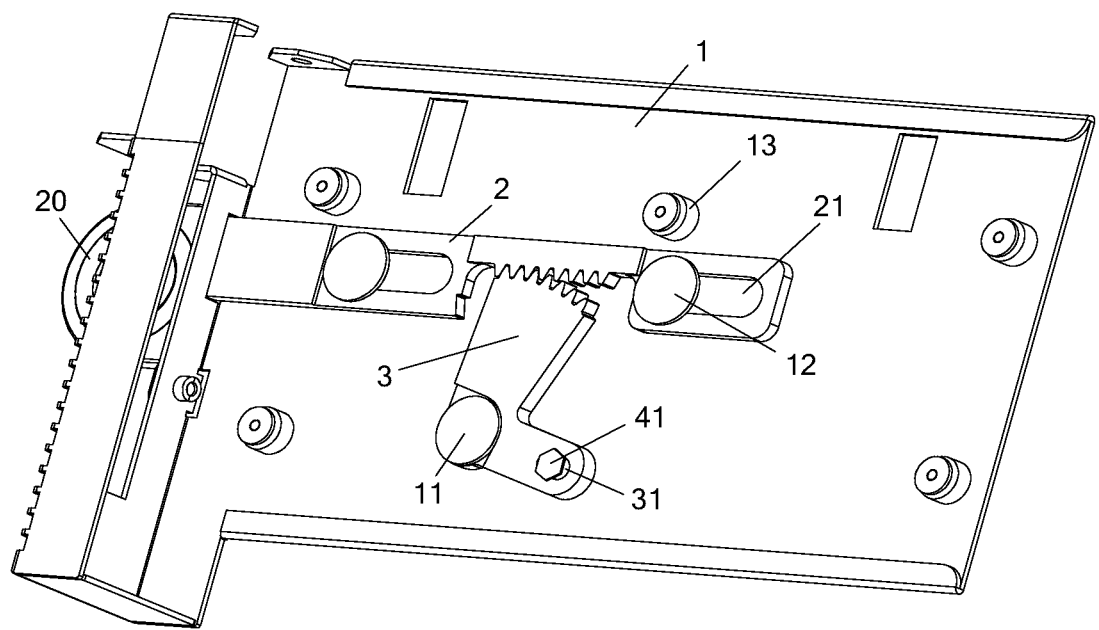
FIG. 1 is a schematic structural diagram of a pluggable apparatus according to Embodiment 1 of the present invention.
Figure 2:
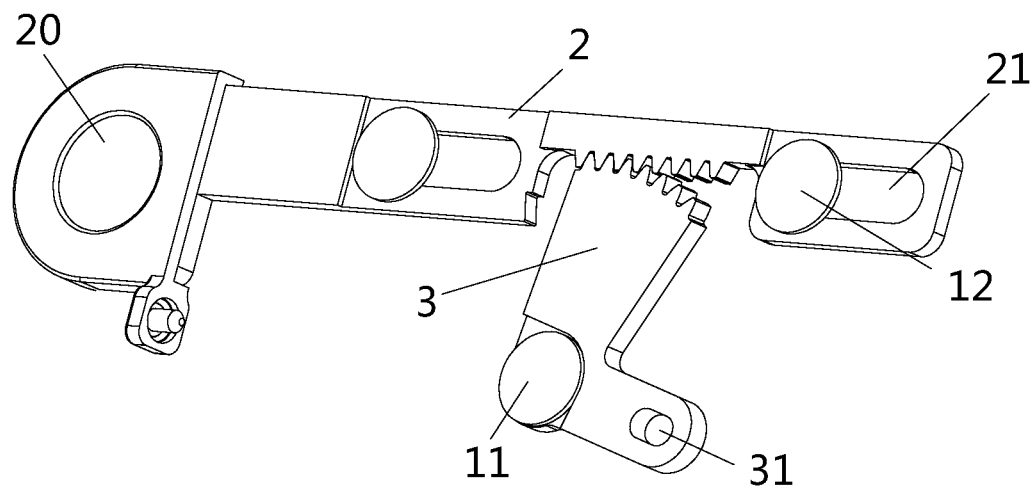
FIG. 2 is a partial schematic diagram of a pulling strip and a rotating member shown in FIG. 1.
Figure 3:
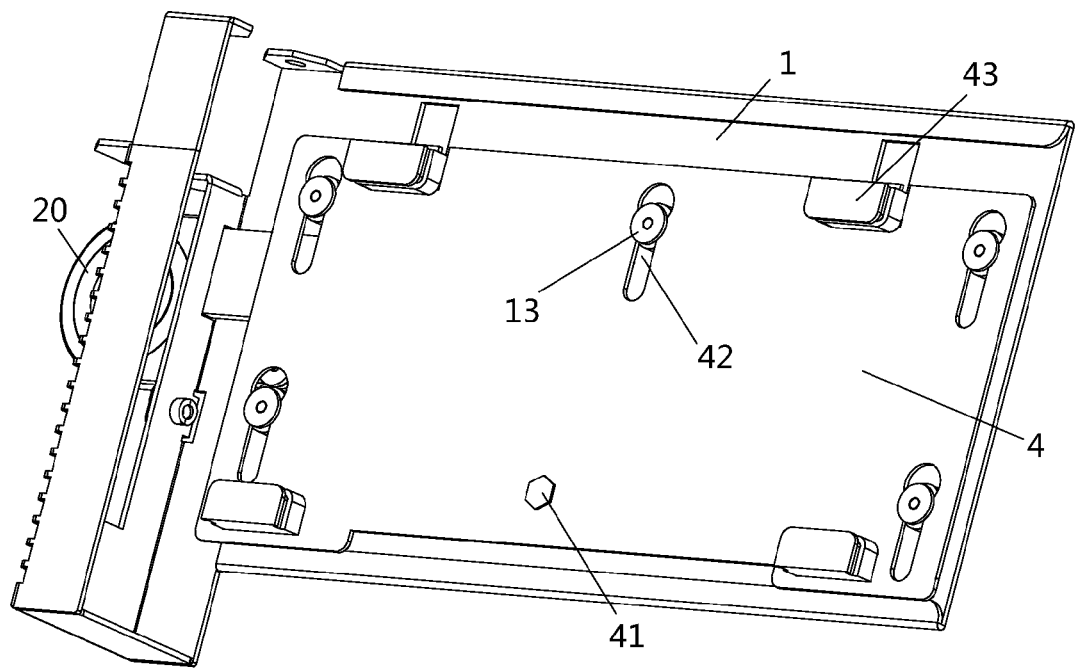
FIG. 3 is another schematic structural diagram of a pluggable apparatus according to Embodiment 1 of the present invention.

As shown in FIG. 1, FIG. 2, and FIG. 3, a pluggable apparatus of a circuit board provided in an embodiment of the present invention includes a base plate 1, a pulling strip 2, a rotating member 3, and a carrier plate 4, where the pulling strip 2 and the rotating member 3 are located between the carrier plate 4 and the base plate 1.

The pulling strip 2 is movably connected to the base plate 1 by using a transverse guide mechanism, and sawteeth are formed on a body of the pulling strip 2. One end of the pulling strip 2 extends out of a plate surface of the base plate 1 and forms a handle 20 that is used as a holding part for moving the pulling strip 2. The rotating member 3 is in a bending line shape, and preferably, a bending angle is 90°. The rotating member 3 includes a first arm, a first rotating shaft (or a hinge) 11, and a second arm; the first rotating shaft 11 is disposed at a turning of the rotating member 3, and the first rotating shaft 11 is configured to movably connect the rotating member 3 and the base plate 1. The first arm and the second arm of the rotating member 3 are connected by using the first rotating shaft 11, sawteeth are formed on a tail end of the first arm and are engaged with the sawteeth on the pulling strip 2, and the second arm is movably connected to the carrier plate 4 by using a transmission mechanism. The carrier plate 4 is movably connected to the base plate 1 by using a longitudinal guide mechanism, and multiple clamping troughs 43 are provided on the carrier plate 4 to fasten the circuit board (such as a PCI-E card).

The transmission mechanism includes a transmission guide trough 31 provided on the second arm of the rotating member 3, and a first fixing pin 41 sheathed in the transmission guide trough 31, where the first fixing pin 41 is connected to the carrier plate 4 in a fixed manner.

A specific implementation manner of the transverse guide mechanism includes a plurality of groups of transverse guide troughs 21 provided on the pulling strip 2, and a second fixing pin 12 fastened on the base plate 1; and the second fixing pin 12 is sheathed in the transverse guide trough 21, so that the pulling strip 2 can transversely move relative to the base plate 1.

In the same way, a specific implementation manner of the longitudinal guide mechanism includes a plurality of groups of longitudinal guide troughs 42 provided on the carrier plate 4, and a third fixing pin 13 fastened on the base plate 1; and the third fixing pin 13 is sheathed in the longitudinal guide trough 42, so that the carrier plate 4 can longitudinally move relative to the base plate 1.

The pulling strip 2 can transversely move relative to the base plate 1 by using the transverse guide mechanism and drive, by using the engaged sawteeth, the rotating member 3 to rotate around the first rotating shaft 11. Because the rotating member 3 is in a bending line shape, under the driving of the pulling strip 2, at the same time when the first arm transversely swings, the second arm longitudinally swings, and the transmission guide trough 31 provided on the second arm drives the first fixing pin 41 and the carrier plate 4 to move; and by cooperating with the longitudinal guide mechanism, the first fixing pin 41 further slides along the transmission guide trough 31 relative to the rotating member 3 while longitudinally moving, thereby implementing longitudinal moving of the carrier plate 4 relative to the base plate 1.

Figure 4:
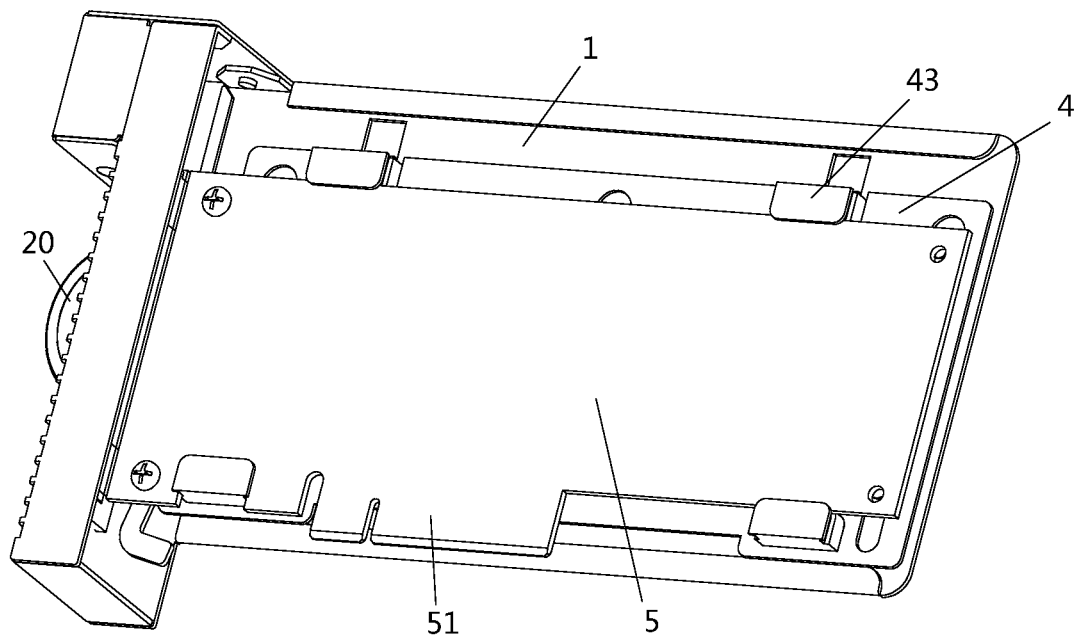
FIG. 4 is a schematic diagram of a pluggable apparatus with a PCI-E card installed according to Embodiment 1 of the present invention.

A PCI-E card 5 is first fastened on the carrier plate 4 through the clamping trough 43 to make the PCI-E card 5 and the pluggable apparatus form an entirety. As shown in FIG. 4, when the PCI-E card 5 is located inside a chassis of a device, in a case that the device is powered on, the carrier plate 4 can drive, by transversely moving the pulling strip 2, the PCI-E card 5 to longitudinally move, so that a connector 51 of the PCI-E card 5 is inserted into or pulled out of a slot inside the device, thereby implementing hot plugging of the PCI-E card 5.

Figure 5:
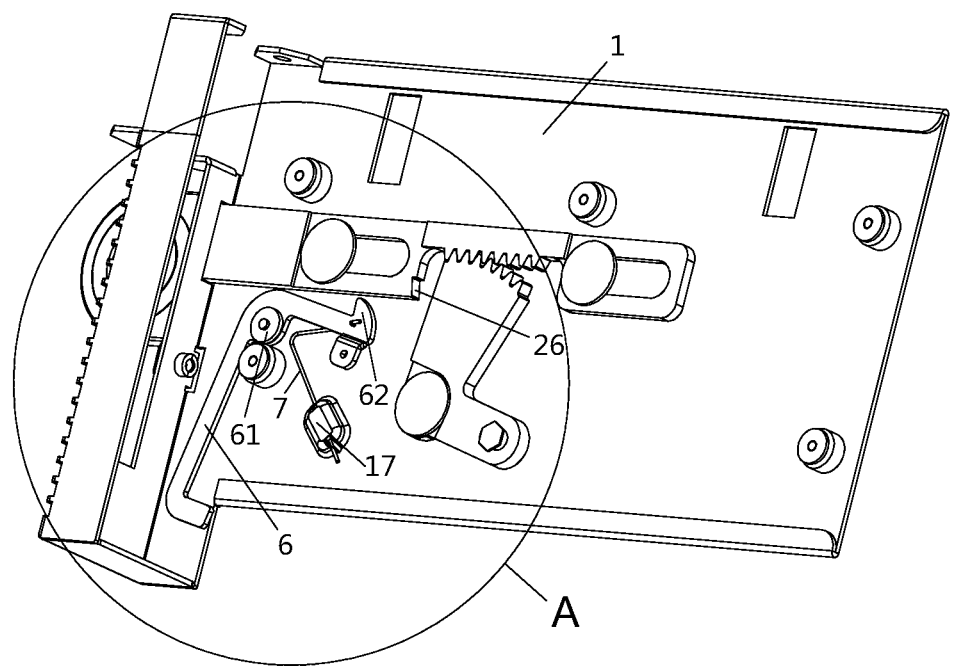
FIG. 5 is a schematic structural diagram of another implementation manner of a pluggable apparatus according to Embodiment 1 of the present invention.
Figure 6:
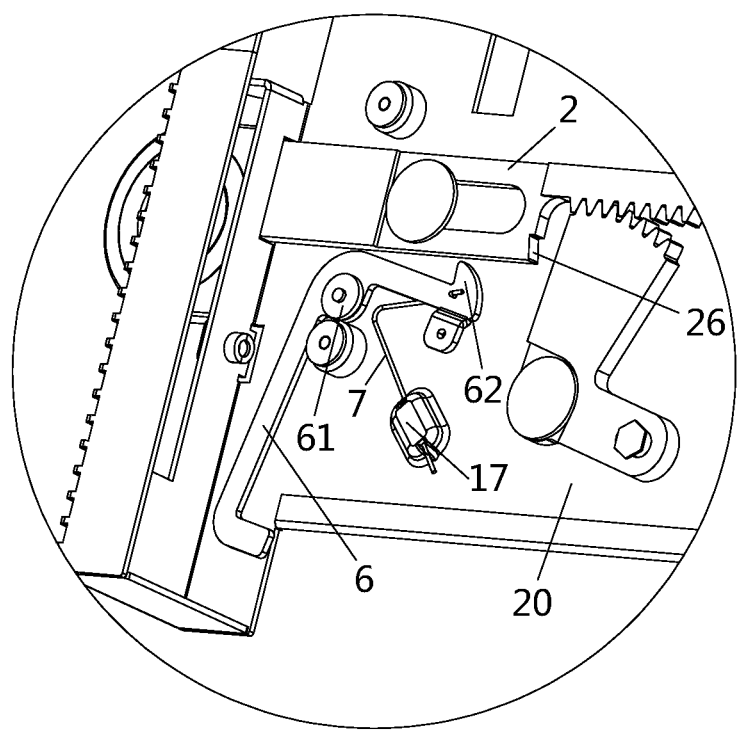
FIG. 6 is a schematic diagram of partially-enlarged part A shown in FIG. 5.

Further, as shown in FIG. 5 and FIG. 6, the pluggable apparatus provided in the embodiment of the present invention may further include a locking structure. The locking structure includes a rotating rod 6 that is in a multi-section bending line shape, a spring 7, and a locking end 26 disposed on the pulling strip 2; the rotating rod 6 is movably connected to the base plate 1 by using a second rotating shaft (or a hinge) 61, and a hook 62 is disposed on a first end of the rotating rod 6; and one end of the spring 7 is fastened on the first end of the rotating rod 6, and the other end is fastened on a convex hull 17 provided on the base plate 1.

When the pulling strip 2 is in a pull-out position, an elastic force of the spring 7 enables the rotating rod 6 to rotate around the second rotating shaft (or a hinge) 61 to a locking position, the hook 62 clamps the locking end 26 on the pulling strip 2, and meanwhile a second end of the rotating rod 6 extends out of the plate surface of the base plate 1. The pulling strip 2 is locked by using the hook 62, and the carrier plate (not shown in the figure) and the PCI-E card (not shown in the figure) fastened on the carrier plate are also locked, so as to prevent the carrier plate and the PCI-E card from longitudinally sliding randomly. Especially in a process of transversely inserting the entirety formed by the pluggable apparatus and the PCI-E card into the chassis, locking the PCI-E card can prevent the connector of the PCI-E card from colliding with the slot or another part inside the chassis, thereby avoiding a possibility of damaging the connector.

When the entirety formed by the pluggable apparatus and the PCI-E card is to be transversely inserted to the bottom, a subrack of the chassis contacts with and pushes the second end of the rotating rod 6 to enable the rotating rod 6 to balance the elastic force of the spring 7 and rotate around the second rotating shaft 61. When the pluggable apparatus is transversely inserted to the bottom, the rotating rod 6 is enabled to exactly rotate to an unlocking position; and in this case, the second end of the rotating rod 6 is pushed inside the plate surface of the base plate, and the hook 62 is detached from the locking end 26 on the pulling strip 2. In this way, the pulling strip 2 can be freely pulled out or pushed into to enable the connector of the PCI-E card 5 to be inserted into or pulled out of the slot inside the device.

It should be noted that, positions of the transverse guide trough and the second fixing pin in the transverse guide mechanism can be interchanged, that is, the transverse guide trough is provided on the base plate and the second fixing pin is fastened on the pulling strip. In the same way, positions of the longitudinal guide trough and the third fixing pin in the longitudinal guide mechanism can also be interchanged.

In addition, the pluggable apparatus of the circuit board provided in the embodiment of the present invention is not only applicable to plugging of the PCI-E card, but also applicable to a circuit board plugging scenario in another form.

Embodiment 2

Figure 7:
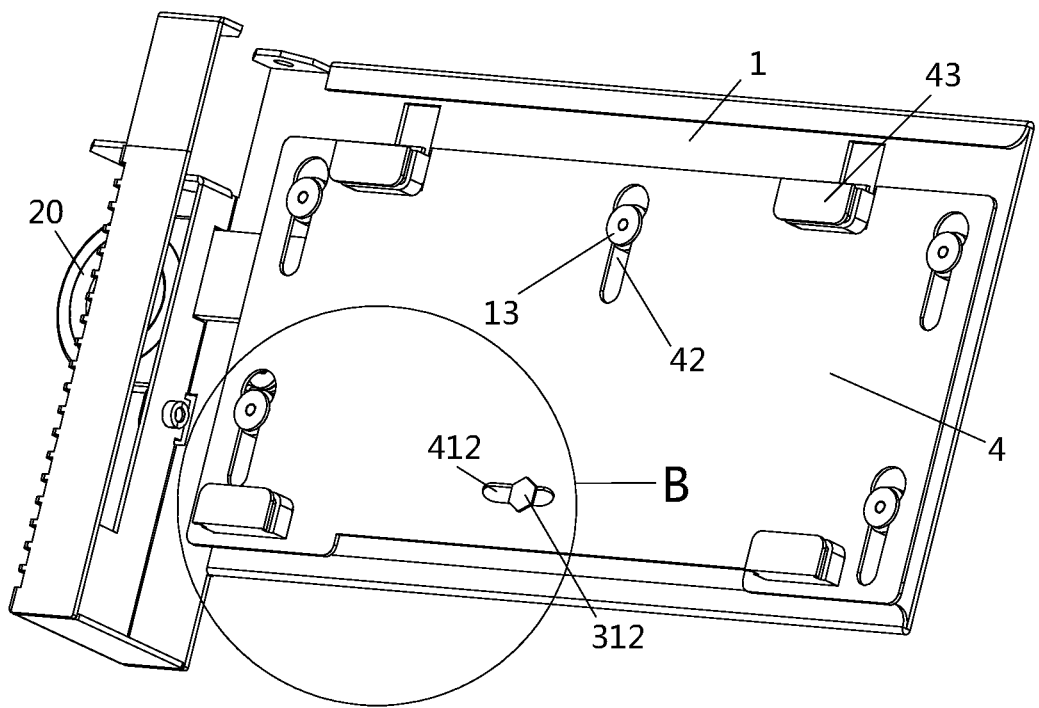
FIG. 7 is a schematic structural diagram of a pluggable apparatus according to Embodiment 2 of the present invention.
Figure 8:
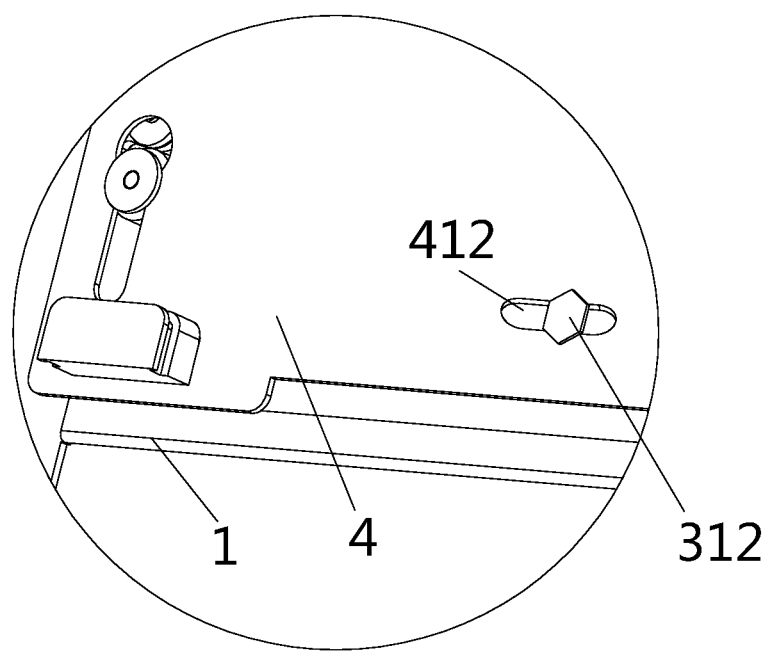
FIG. 8 is a schematic diagram of partially-enlarged part B shown in FIG. 7.

This embodiment is substantially the same as Embodiment 1. A difference is that: as shown in FIG. 7 and FIG. 8, in this embodiment, the transmission mechanism includes a transmission guide trough 412 provided on the carrier plate 4, and a first fixing pin 312 sheathed in the transmission guide trough 412, where the first fixing pin 312 is fastened on the second arm of the rotating member (not shown in the figure). Preferably, the transmission guide trough 412 transversely extends, and a transverse moving range of the first fixing pin 312 is used as a length of the transmission guide trough 412 in a rotation process of the rotating member.

When the rotating member 3 rotates, with cooperation between the first fixing pin 312 and the longitudinal guide mechanism, the carrier plate 4 is driven to longitudinally move, and meanwhile, the first fixing pin 312 further transversely slides along the transmission guide trough 412 relative to the carrier plate 4.

It should be noted that, implementation manners of the transmission mechanism between the second arm of the rotating member and the carrier plate are not limited to the two kinds in Embodiment 1 and Embodiment 2. For example, the implementation manner of the transmission mechanism may further be similar to an implementation manner in which sawteeth between the pulling strip and the first arm of the rotating member are engaged, or the like.

Embodiment 3

Figure 9:
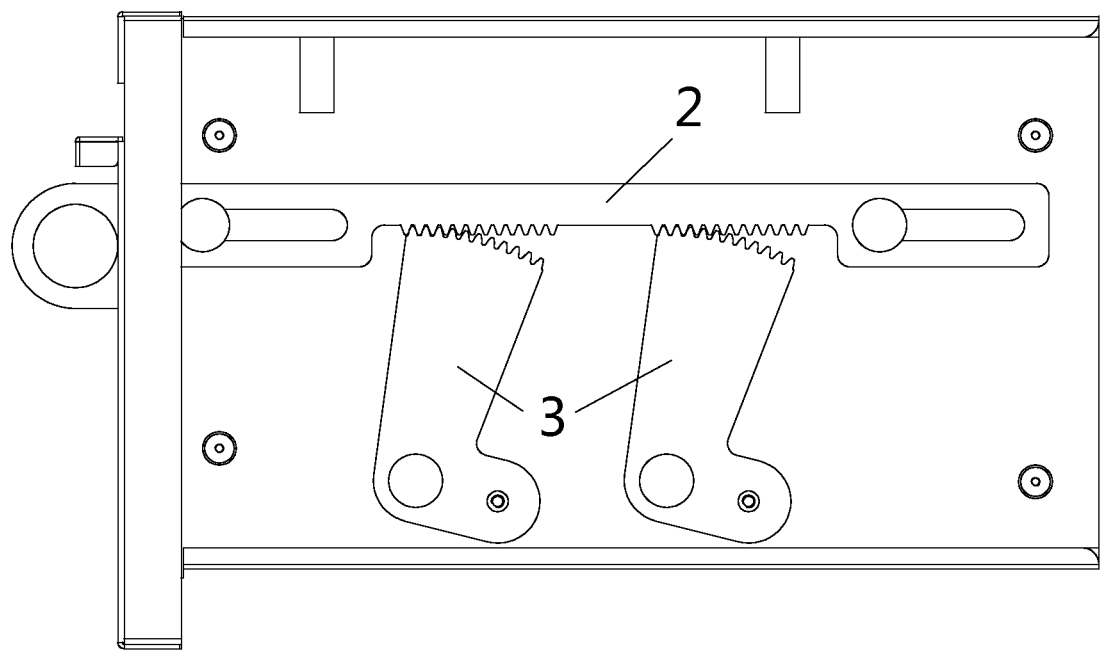
FIG. 9 is a schematic structural diagram of a pluggable apparatus according to Embodiment 3 of the present invention.

This embodiment is substantially the same as Embodiment 2. A difference is that: as shown in FIG. 9, in this embodiment, there are two rotating members 3, sawteeth on a tail end of a first arm of each rotating member 3 are engaged with the sawteeth on the pulling strip 2.

The pulling strip 2 drives the two rotating members 3 to simultaneously rotate, and the two rotating members 3 simultaneously drive the carrier plate (not shown in the figure) to longitudinally move. That is, the carrier plate has two force bearing points, so that stress of the carrier plate is more balanced and a moving process is more stable. In addition, if one of the rotating members is damaged, the other rotating member can also independently drive the carrier plate to longitudinally move.

Embodiment 4

Figure 10:
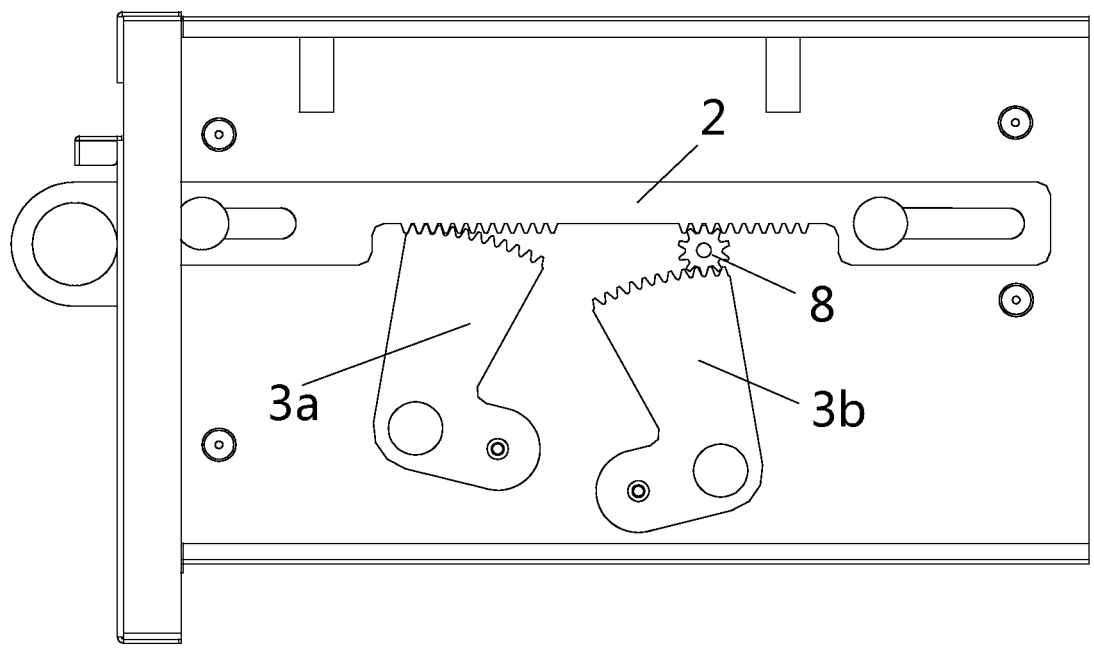
FIG. 10 is a schematic structural diagram of a pluggable apparatus according to Embodiment 4 of the present invention.

This embodiment is substantially the same as Embodiment 3, and there are also two rotating members. A difference is that: as shown in FIG. 10, a reversing gear 8 is further disposed on the base plate; and sawteeth on a tail end of a first arm of a rotating member 3a are engaged with the sawteeth on the pulling strip 2, sawteeth on a tail end of a first arm of a rotating member 3b are engaged with the reversing gear 8, and the reversing gear 8 is further engaged with the sawteeth on the pulling strip 2.

In this embodiment, the reversing gear 8 is disposed between the rotating member 3b and the pulling strip 2, that is, the rotating member 3b is indirectly engaged with the pulling strip 2 by using the reversing gear 8, so that rotation directions of the two rotating members, that is, 3a and 3b, may be opposite, and transverse acting force of the two rotating members, that is, 3a and 3b, acting on the carrier plate (not shown in the figure) can be mutually counteractive, thereby further improving stability in a moving process of the carrier plate.

Embodiment 5

Figure 11:
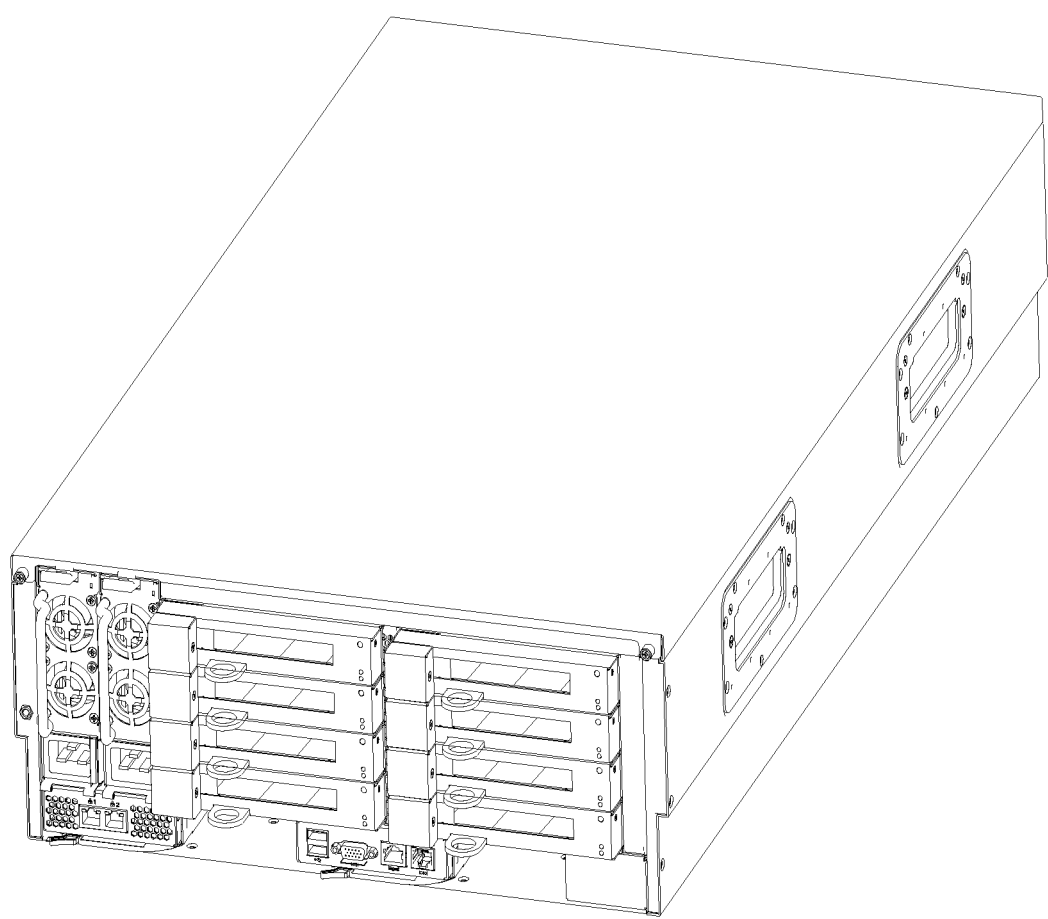
FIG. 11 is a schematic structural diagram of a server according to an embodiment of the present invention.

As shown in FIG. 11, an embodiment of the present invention further provides a server, and the interior of a chassis of the server includes a slot, a circuit board (a PCI-E card in this embodiment), and any pluggable apparatus according to Embodiment 1 to Embodiment 4. As shown in FIG. 11, in this embodiment, eight subracks are disposed on the chassis, and one pluggable apparatus is inserted into each subrack. The PCI-E card can be fastened on the pluggable apparatus to form an entirety and inserted into the chassis. In this way, in a condition that the server is powered on, a connector of the PCI-E card is inserted into the slot by using the pluggable apparatus or the connector of the PCI-E card is pulled out of the slot, thereby implementing hot plugging of the PCI-E card.

The pluggable apparatus of the circuit board provided in this embodiment of the present invention has the same technical feature as the pluggable apparatus of the circuit board provided in the foregoing embodiments of the present invention, so that the same technical effect can be created and the same technical problem can be solved.

The foregoing descriptions are merely specific implementation manners of the present invention, but are not intended to limit the protection scope of the present invention. Any variation or replacement readily figured out by a person skilled in the art within the technical scope of the present invention shall all fall within the protection scope of the present invention. Therefore, the protection scope of the present invention shall be subject to the protection scope of the claims.

What is claimed is:

1. A pluggable apparatus of a circuit board, comprising:
    a base plate;
    a pulling strip;
    a rotating member; and
    a carrier plate,
    wherein the pulling strip is movably connected to the base plate by using a transverse guide mechanism, sawteeth are formed on a body of the pulling strip, and the pulling strip further comprises a handle that extends out of the base plate, wherein the handle is used as a holding part for moving the pulling strip,
    wherein the rotating member is in a bending line shape, and the rotating member comprises a first arm, a first rotating shaft, and a second arm, wherein the first rotating shaft is disposed at a turning of the rotating member, and the first rotating shaft is configured to movably connect the rotating member and the base plate, wherein the first arm and the second arm are connected by using the first rotating shaft, wherein sawteeth are formed on a tail end of the first arm and are engaged with the sawteeth on the pulling strip, and the second arm is movably connected to the carrier plate by using a transmission mechanism, wherein the carrier plate is movably connected to the base plate by using a longitudinal guide mechanism, and wherein a clamping trough is provided on the carrier plate and is configured to fasten the circuit board.

2. The pluggable apparatus according to claim 1, wherein the transmission mechanism comprises a transmission guide trough provided on the second arm of the rotating part, and a first fixing pin sheathed in the transmission guide trough, wherein the first fixing pin is connected to the carrier plate in a fixed manner.

3. The pluggable apparatus according to claim 1, wherein the transmission mechanism comprises a transmission guide trough provided on the carrier plate, and a first fixing pin sheathed in the transmission guide trough, wherein the first fixing pin is fastened on the second arm of the rotating member.

4. The pluggable apparatus according to claim 2, wherein the transmission guide trough transversely extends.

5. The pluggable apparatus according to claim 1, wherein the transverse guide mechanism comprises a transverse guide trough provided on the pulling strip, and a second fixing pin fastened on the base plate, wherein the second fixing pin is sheathed in the transverse guide trough.

6. The pluggable apparatus according to claim 1, wherein the longitudinal guide mechanism comprises a longitudinal guide trough provided on the carrier plate, and a third fixing pin fastened on the base plate, wherein the third fixing pin is sheathed in the longitudinal guide trough.

7. The pluggable apparatus according to claim 1, further comprising a locking structure, wherein the locking structure comprises a rotating rod, a spring, and a locking end disposed on the pulling strip, wherein the rotating rod is movably connected to the base plate by using the second rotating shaft and a hook is disposed on a first end of the rotating rod, wherein one end of the spring is fastened on the rotating rod and the other end is fastened on the base plate, wherein when the pulling strip is in a pull-out position, an elastic force of the spring enables the rotating rod to rotate around the second rotating shaft to a locking position, the hook clamps the locking end on the pulling strip, and meanwhile a second end of the rotating rod extends out of a plate surface of the base plate, and wherein when an external object pushes the second end of the rotating rod to enable the rotating rod to rotate around the second rotating shaft to an unlocking position, the second end of the rotating rod is pushed inside the plate surface of the base plate, and the hook is detached from the locking end on the pulling strip.

8. The pluggable apparatus according to claim 1, wherein the pluggable apparatus comprises more than two rotating members, and wherein sawteeth on a tail end of a first arm of each of the rotating members are engaged with the sawteeth on the pulling strip.

9. The pluggable apparatus according to claim 1, wherein the pluggable apparatus comprises more than two rotating members, wherein at least one reversing gear is further disposed on the base plate, and wherein sawteeth on a tail end of a first arm of at least one rotating member are engaged with the sawteeth on the pulling strip, sawteeth on a tail end of a first arm of at least one rotating member are engaged with the one reversing gear, and the reversing gear is further engaged with the sawteeth on the pulling strip.

10. A server, comprising:

a chassis; and an interior of the chassis, wherein the interior of the chassis of the server comprises a slot, a circuit board, and a pluggable apparatus, wherein the circuit board is fastened on a carrier plate of the pluggable apparatus through a clamping trough of the carrier plate, and the pluggable apparatus is configured to insert a connector of the circuit board into the slot or pull a connector of the circuit board out of the slot, wherein the pluggable apparatus comprises a base plate, a pulling strip, a rotating member, and a carrier plate, wherein the pulling strip is movably connected to the base plate by using a transverse guide mechanism, sawteeth are formed on a body of the pulling strip, and the pulling strip further comprises a handle that extends out of the base plate, wherein the handle is used as a holding part for moving the pulling strip, wherein the rotating member is in a bending line shape, and the rotating member comprises a first arm, a first rotating shaft, and a second arm, wherein the first rotating shaft is disposed at a turning of the rotating member, and the first rotating shaft is configured to movably connect the rotating member and the base plate, wherein the first arm and the second arm are connected by using the first rotating shaft, wherein sawteeth are formed on a tail end of the first arm and are engaged with the sawteeth on the pulling strip, and the second arm is movably connected to the carrier plate by using a transmission mechanism, wherein the carrier plate is movably connected to the base plate by using a longitudinal guide mechanism, and wherein a clamping trough is provided on the carrier plate and is configured to fasten the circuit board.

* * * * *